United States Patent
Akiba

(10) Patent No.: US 6,255,679 B1
(45) Date of Patent: Jul. 3, 2001

(54) FIELD EFFECT TRANSISTOR WHICH CAN OPERATE STABLY IN MILLIMETER WAVE BAND

(75) Inventor: Yasuhiro Akiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/332,223

(22) Filed: Jun. 14, 1999

(30) Foreign Application Priority Data

Jun. 29, 1998 (JP) .................................................. 10-181815

(51) Int. Cl.$^7$ .................................................. H01L 29/812
(52) U.S. Cl. ........................ 257/284; 257/280; 257/287; 257/471
(58) Field of Search .................................... 257/287, 341, 257/358, 363, 401, 471, 280, 284

(56) References Cited

U.S. PATENT DOCUMENTS

| | | | |
|---|---|---|---|
| 5,567,647 | * 10/1996 | Takahashi et al. | 438/573 |
| 5,981,322 | * 11/1999 | Keeth et al. | 438/199 |
| 6,020,613 | * 2/2000 | Udomoto et al. | 257/341 |
| 6,023,086 | * 2/2000 | Reyes et al. | 257/341 |
| 6,025,614 | * 2/2000 | Ogawa et al. | 257/192 |

FOREIGN PATENT DOCUMENTS

| | | |
|---|---|---|
| 59-171171 | 9/1984 | (JP) . |
| 60-225478 | 11/1985 | (JP) . |
| 63-127575 | 5/1988 | (JP) . |
| 2-110943 | 4/1990 | (JP) . |
| 4-346467 | 12/1992 | (JP) . |
| 5-275465 | 10/1993 | (JP) . |
| 6-5636 | 1/1994 | (JP) . |
| 6-188379 | 7/1994 | (JP) . |
| 7-235666 | 9/1995 | (JP) . |
| 9-8063 | 1/1997 | (JP) . |
| 9-153499 | 6/1997 | (JP) . |

* cited by examiner

*Primary Examiner*—Eddie C. Lee
*Assistant Examiner*—Allan R. Wilson

(57) ABSTRACT

In order to achieve an aspect of the present invention, in a field effect transistor, a compound semiconductor substrate has an active region, and a gate finger electrode is formed on the active region. Source and drain stripe electrodes are formed on the active region to sandwich the gate finger electrode apart from the gate finger electrode. An extended gate electrode is connected with the gate finger electrode and extended source and drain electrodes are connected with the source and drain stripe electrodes, respectively. A resistance section is provided between the gate finger electrode and the extended gate electrode in the transistor forming region.

14 Claims, 5 Drawing Sheets

FIELD EFFECT TRANSISTOR WHICH CAN OPERATE STABLY IN MILLIMETER WAVE BAND

BACKGROUND OF THE INVENTION

1. Field of the Invention

The present invention relates to a field effect transistor and a method of manufacturing the same, and more particularly to a field effect transistor which can operate stably at a microwave band including a millimeter wave band, and a method of manufacturing the same.

2. Description of the Related Art

Generally, a field effect transistor with a Schottky gate becomes unstable in the operation at a high frequency. That is, a K factor becomes 1 or below in a millimeter wave band depending on the operation condition of an field effect transistor so that the field effect transistor possibly oscillates. In order to eliminate the operation instability of the field effect transistor in this millimeter wave band, a resistance of several ohms has been conventionally inserted in the series with a gate circuit. In other words, the operation of the field effect transistor becomes unstable because a gate input impedance becomes low in the millimeter wave band. However, by addition of the resistance, a loss is inserted effectively. Therefore, the K factor can be made equal to or more than 1 by the resistance, and the operation stability of the field effect transistor can be attempted.

The resistance to be inserted in the series with the gate circuit is conventionally provided outside the field effect transistor. For this reason, a special space becomes necessary to form the resistance in the field effect transistor. Therefore, in the integrated circuit, this space functions as a bar against the small size of a device. Also, a special photolithography process becomes necessary to form the resistance. Therefore, the number of processes increases to cause the cost up.

In conjunction with the above, a multiple cell type micro wave field effect transistor is described in Japanese Laid Open Patent Application (JP-A-Showa 63-127575). In this reference, a plurality of unit cells are connected in parallel. A gate electrode and a drain electrode in one unit cell are connected with a gate electrode and a drain electrode in an adjacent unit cell via resistance bodies.

Also, a field effect transistor is described in Japanese Laid Open Patent Application (JP-A-Heisei 2-110943). In this reference, a resistance body is provided to connect between gate stripe electrodes or between drain stripe electrodes.

SUMMARY OF THE INVENTION

Therefore, an object of the present invention is to provide a field effect transistor which has a resistance section for the stable operation without increasing an element area and without increasing the number of processes.

Another object of the present invention is to provide a method of manufacturing a field effect transistor with such a resistance section.

In order to achieve an aspect of the present invention, in a field effect transistor, a compound semiconductor substrate has an active region, and a gate finger electrode is formed on the active region. Source and drain stripe electrodes are formed on the active region to sandwich the gate finger electrode apart from the gate finger electrode. An extended gate electrode is connected with the gate finger electrode and extended source and drain electrodes are connected with the source and drain stripe electrodes, respectively. A resistance section is provided between the gate finger electrode and the extended gate electrode in the transistor forming region.

The resistance section is preferably formed of a gate metal layer which has a Schottky contact with the active region. Also, the gate finger electrode and the extended gate electrode may be formed the gate metal layer and a first metal layer formed on the gate metal layer.

Also, a plurality of gate finger electrodes may extend from a gate bus bar, and the resistance section may be formed between the extended gate electrode and the gate bus bar.

The gate metal layer preferably has a laminate structure of a Schottky material layer having Schottky contact with the active layer and a second metal layer. In this case, the Schottky material layer may be formed of a material selected from the group consisting of W, Ni, Ti, Pt, Mo, and WSi. The gate metal layer preferably includes a barrier layer formed between the Schottky material layer and the second metal layer. In this case, the barrier layer is formed of TiN.

The compound semiconductor substrate may be a GaAs substrate.

In order to achieve another aspect of the present invention, a method of manufacturing a field effect transistor, includes:

forming an element separation insulating film on a semiconductor substrate having a channel layer and a contact layer;

forming a gate structure of a gate finger electrode on the channel layer, and a gate bus bar and an extended gate electrode on the element separation insulating film;

forming a resistance section between the gate bus bar and the extended gate electrode while the gate structure is formed; and forming a source stripe electrode and a drain stripe electrode on the contact layer to sandwich the gate finger electrode apart from the gate finger electrode.

When the gate structure is formed, a gate metal layer is formed to have Schottky contact with the channel layer. A first metal layer is partially formed on the gate metal layer for the gate finger electrode, the gate bus bar and the extended gate electrode, and the gate metal layer is patterned for the gate finger electrode, the gate bus bar, the resistance section and the extended gate electrode, whereby the resistance section is formed.

The forming the gate metal layer includes: forming a Schottky material layer having Schottky contact with the channel layer; and forming a second metal layer on the Schottky material layer. barrier layer may be formed between the Schottky material layer and the second metal layer.

In order to achieve still another aspect of the present invention, in a field effect transistor, a substrate has an insulating film formed on the substrate and a compound semiconductor channel layer surrounded by the insulating film and a compound semiconductor contact layer formed on the channel layer. A gate metal layer is formed on the channel layer and the insulating film to have a first pattern for a gate finger electrode, a gate bus bar, a resistance section and an extended gate electrode. A first metal layer is formed on the gate metal layer have a second pattern for the gate finger electrode, the gate bus bar, and the extended gate electrode. A second metal layer is formed on the contact layer to sandwich the gate finger electrode apart from the gate finger electrode for a source stripe electrode and a drain stripe electrode.

DESCRIPTION OF THE PREFERRED EMBODIMENTS

A field effect transistor of the present invention will be described below in detail with reference to the attached drawings.

Figure 1:
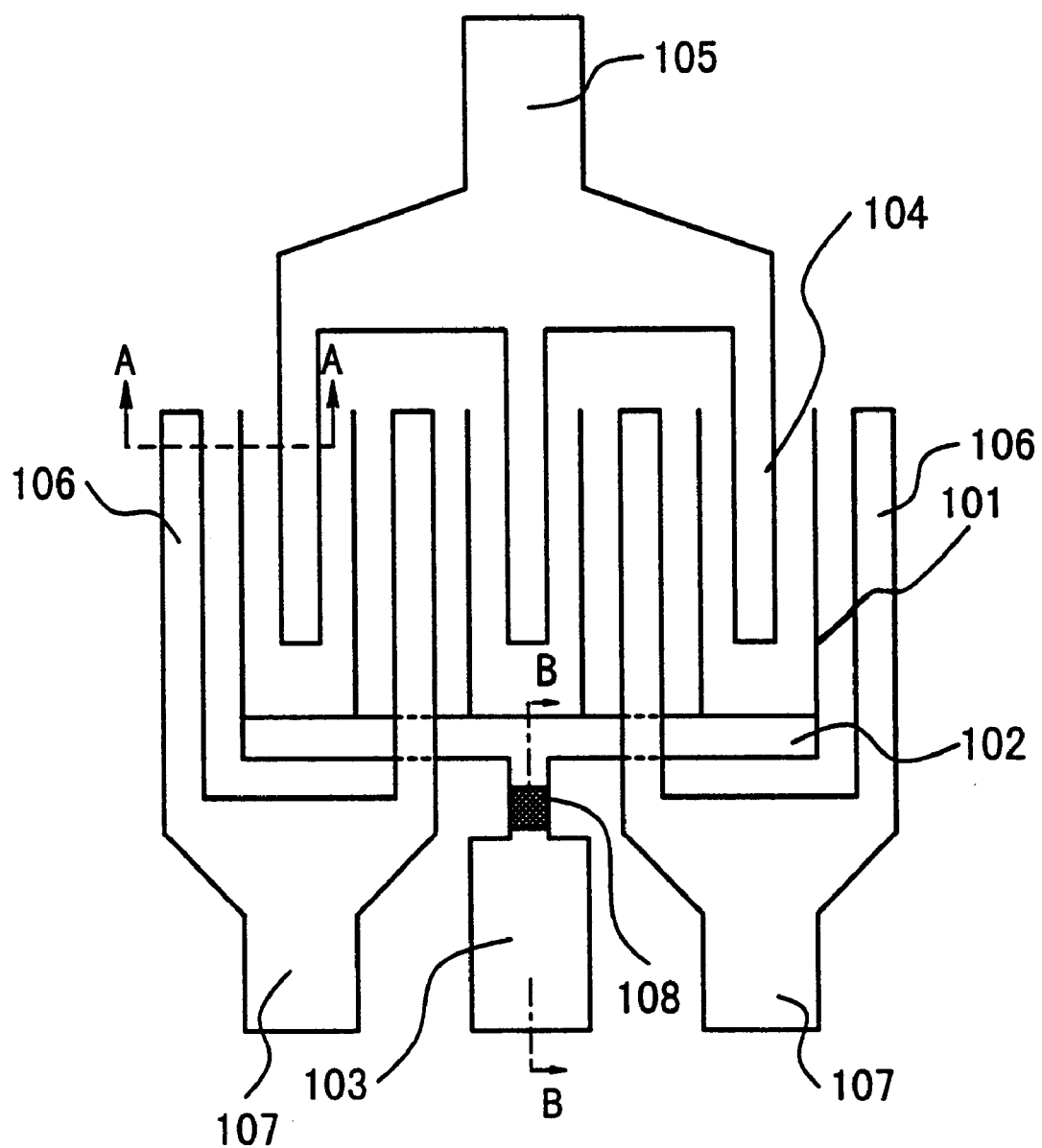
FIG. 1 is a plan view of a field effect transistor according to a first embodiment of the present invention.

FIG. 1 is a plan view of the field effect transistor according to the first embodiment of the present invention. Referring to FIG. 1, a resistance section 108 for the operation stabilization is inserted between an extended gate electrode 103 and a gate bus bar 102 which are formed on a compound semiconductor substrate. The resistance section 103 is formed of a gate metal layer to be mentioned later. A plurality of gate finger electrodes 101 are drawn out to extend from the gate bus bar 102. A drain stripe electrode 104 and a source stripe electrode 106 are formed on both sides of each of the gate finger electrodes 101 to sandwich the gate finger electrode 101 apart from the gate finger electrode 101. The drain stripe electrode 104 and the source stripe electrode 106 are drawn out to extend from the extended drain electrode 105 and the extended source electrode 107, respectively.

The compound semiconductor substrate such as GaAs may be formed by selectively implanting an n-type dopant into a semi-insulative compound semiconductor substrate. Instead, the compound semiconductor substrate may be formed by selectively implanting a dopant into a semi-insulative substrate on which an n-type GaAs epitaxial layer or a hetero-junction epitaxial layer is formed, to make the epitaxial layer insulative.

Also, the gate metal layer may be formed of a single Schottky material layer which forms a Schottky junction with an active region. Otherwise, the gate metal layer may be formed as a multiple layer which contains a Schottky material layer and a low resistivity metal layer which functions as a lower layer when the high conductive metal layer is formed by a planting method. As the Schottky material layer, a layer formed of W, Ni, Ti, Pt, Mo, and/or WSi can be used. Also, as the low resistivity metal layer, a layer of Pt and/or Au can be used. In addition, it is possible to form a barrier layer of TiN between the Schottky material layer and the low resistivity metal layer.

Next, a method of manufacturing of the field effect transistor according to the first embodiment of the present invention will be described below with reference to FIGS. 2A to 2L and FIGS. 3A to 3D. In this example, FIGS. 2A to 2L are cross sectional views of the field effect transistor along the line A—A shown in FIG. 1 and FIGS. 3A to 3D are cross sectional views of the field effect transistor along the line B—B shown in FIG. 1.

Figure 2A:
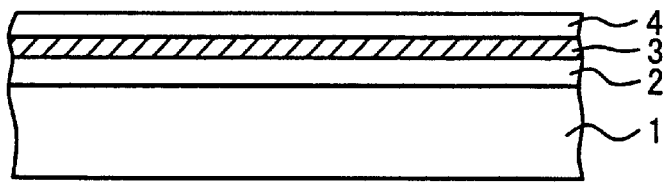
FIGS. 2A to 2L are cross sectional views of the field effect transistor along the line A—A shown in FIG. 1 in a method of manufacturing the same according to the first embodiment of the present invention.

First, as shown in FIG. 2A, a non-doped GaAs buffer layer 2 is formed on a semi-insulative GaAs substrate 1 by a MOCVD method to have the film thickness of 400 nm. Subsequently, a Si-doped n-type AlGaAs channel layer 3 is formed to have the film thickness of 50 nm. Then, a Si-doped n-type GaAs contact layer 4 is formed to have the film thickness of 100 nm. The three layers are grown in order in this way to form an epitaxial substrate.

Figure 2B:
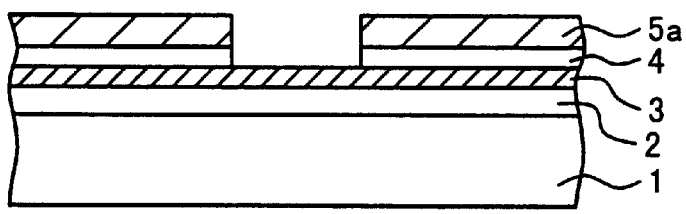

Next, as shown in FIG. 2B, a photo-resist film 5a is formed to have an opening portion 5 in a region where a gate finger electrode is to be formed. Then, the n-type GaAs contact layer 4 is selectively etched and removed by a RIE method using the photo-resist layer 5a as a mask, to form a first wide recess section.

Figure 2C:
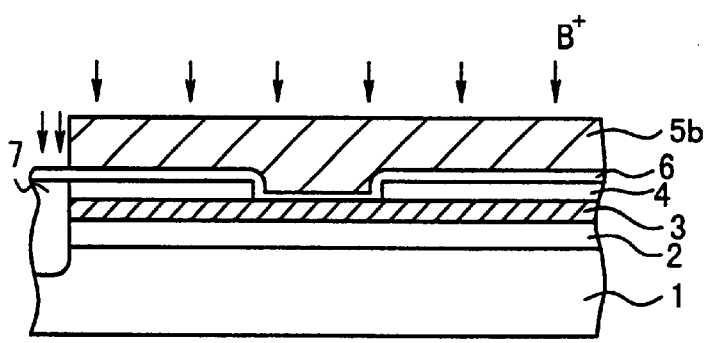
Figure 3A:
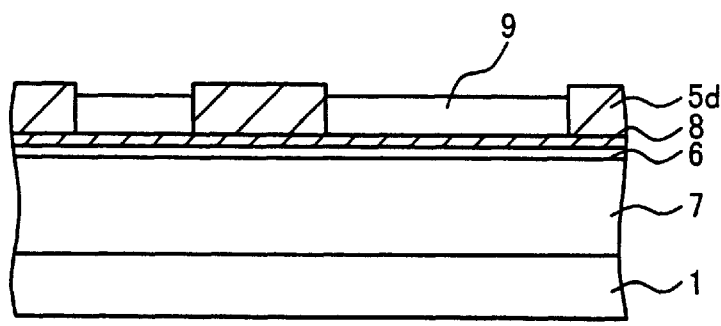
FIGS. 3A to 3D are cross sectional views of the field effect transistor along the line B—B shown in FIG. 1 in a method of manufacturing the same according to the first embodiment of the present invention.

Next, as shown in FIG. 2C, the photo-resist film 5a is removed. Subsequently, a silicon oxide film 6 is deposited by a CVD method to have the film thickness of 150 nm. Then, a photo-resist film 5b is formed to cover a region which functions as an active region of the field effect transistor. Boron ions are implanted using the photo-resist film 5b as a mask to form an insulating separation film 7. Thus, the insulating separation film 7 and the silicon oxide film 6 are also formed in a region for the gate bus bar 102 and the extended gate electrode 103, as shown in FIG. 3A.

Figure 2D:
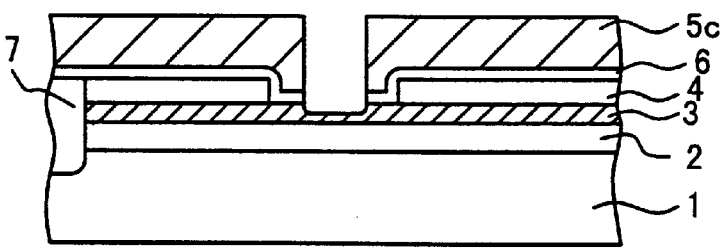

Next, as shown in FIG. 2D, the photo-resist film 5b is removed and then a photo-resist film 5c is newly formed to have an opening portion in a region where a gate opening portion is to be formed. The silicon oxide film 6 is selectively removed by the RIE method using the photo-resist film 5c as a mask. Subsequently, a part of the surface of the n-type AlGaAs channel layer 3 is removed by a wet method to form a second recess section.

Figure 2E:
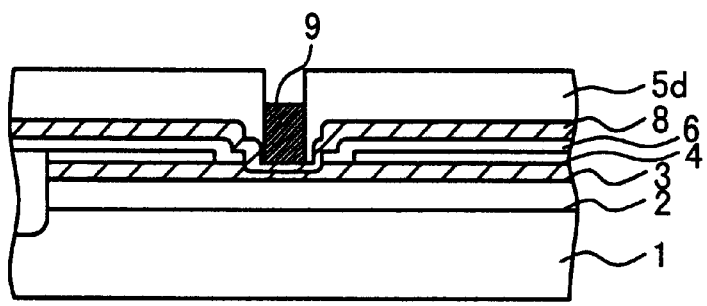

Next, as shown in FIG. 2E, the photo-resist film 5c is removed. Subsequently, by a sputtering method, a WSi film is formed to have the film thickness of 100 nm, and a TiN film is formed to have the film thickness of 100 nm, and then a Pt film is formed to have the film thickness of 30 nm. In this way, a gate metal layer 8 in which a plurality layers are laminated in order is formed. The gate metal layer 8 is also formed on the gate bus bar 102 and the extended gate electrode 103, as shown in FIG. 3A.

Next, a photo-resist film 5d is formed to have opening portions on a gate electrode forming region for a gate structure which contains the gate finger 101, the gate bus bar 102, and the extended gate electrode 103. Then, an AU layer is formed by an electrolysis plating method using the photo-resist film 5d as a mask to have the film thickness of about 1 μm, resulting formation of an AU plating film 9, as shown in FIG. 3A.

Figure 2F:
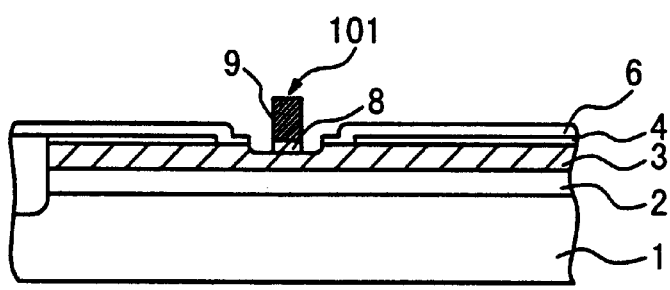
Figure 3B:
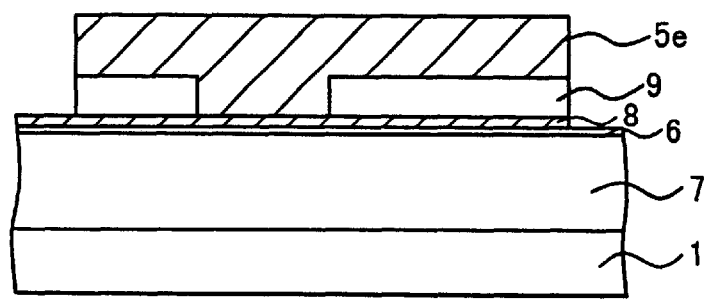

Next, as shown in FIG. 2F, the photo-resist film 5d is removed, and then a photo-resist film 5e is newly formed to cover the gate electrode other than the gate finger electrodes and the resistance section forming region, as shown in FIG. 3B.

Figure 3C:
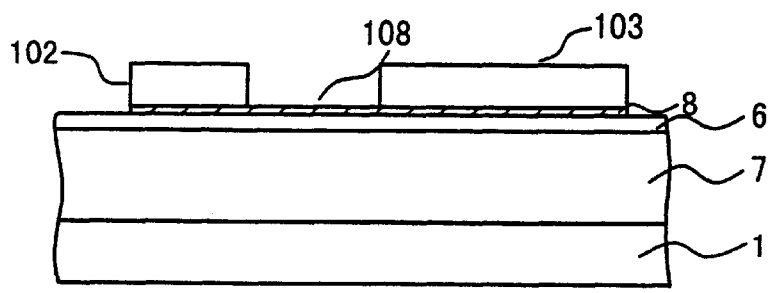

Next, the Pt film is patterned by a ion milling method using the Au plating film 9 and the photo-resist film 5e as a mask. Subsequently, the TiN film and the WSi film are etched by the RIE method. In this way, the gate metal film 8 is patterned to have a predetermined pattern to form the resistance section 108, as shown in FIG. 3C. Thereafter, the photo-resist film 5e is removed.

In this case, the Au plating film 9 is covered with the photo-resist film 5e, when the gate metal film 8 is patterned. This is to prevent the Au plating film 9 from being decreased in film thickness by the ion milling method and the RIE method. Since it is difficult to cover the gate finger electrodes 101 with the photo-resist film 5e without displacement between the photo-resist film 5e and the gate finger electrodes 101 in the viewpoint of the lithography technique, the gate finger electrodes 101 are not covered with the photo-resist film 5e.

Figure 3D:
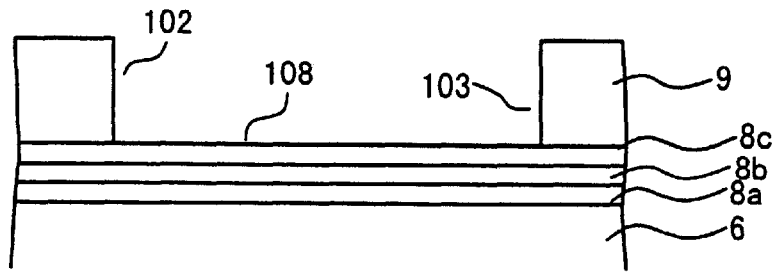

FIG. 3D is a partial expanded view of a portion shown in FIG. 3C. The resistance section 108 is formed between the gate bus bar 102 and the extended gate electrode 103 to have a laminate structure of the WSi layers 8a, the TiN layer 8b and the Pt layers 8c.

Figure 2G:
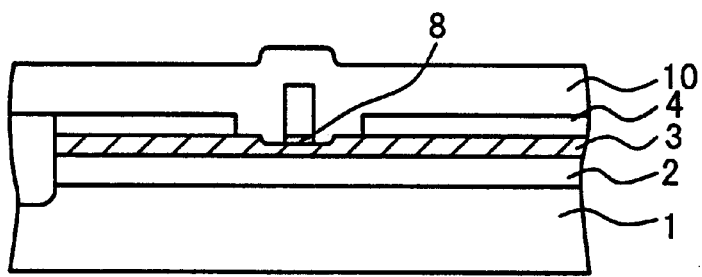

After that, as shown in FIG. 2G, a silicon oxide film 10 is deposited by a CVD method to function as a protection film. The silicon oxide film 6 is contained in the silicon oxide film 10 in the description hereinafter.

Figure 2H:
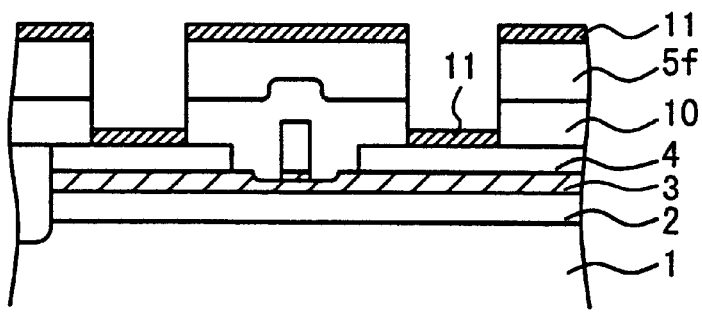
Figure 2I:
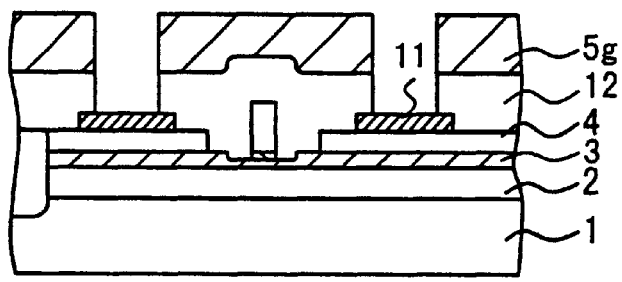

Next, as shown in FIG. 2H, a photo-resist film 5f is formed to have an opening on an ohmic electrode forming region. The silicon oxide film 10 is selectively etched using the photo-resist film 5f as a mask to form an electrode window. Then, by a sputtering method, a Ni layer of 8 nm, an AuGe film of 50 nm and an Au film of 250 nm are laminated to form an ohmic metal film 11.

Next, the photoresist film 5f is removed so that an excess portion of the ohmic metal layer 11 is lifted off. Then, a silicon oxide film 12 is deposited on the whole surface by a CVD method to function as a surface protection film. It should be noted that the silicon oxide film 6 and silicon oxide film 10 are contained in the silicon oxide film 12 in the description hereinafter. Subsequently, a photo-resist film 5g is formed to have an opening on a contact hall forming region. The silicon oxide film 12 is selectively removed by the RIE method using the photo-resist film 5g as a mask. Thus, the surface of the ohmic metal film is exposed so that a contact hall is formed.

Figure 2J:
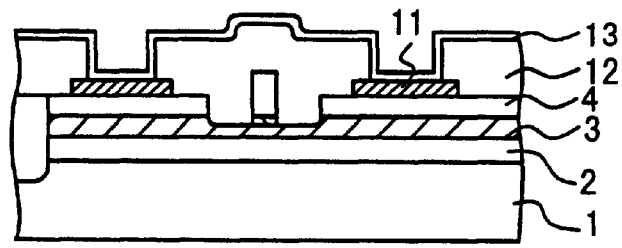
Figure 2K:
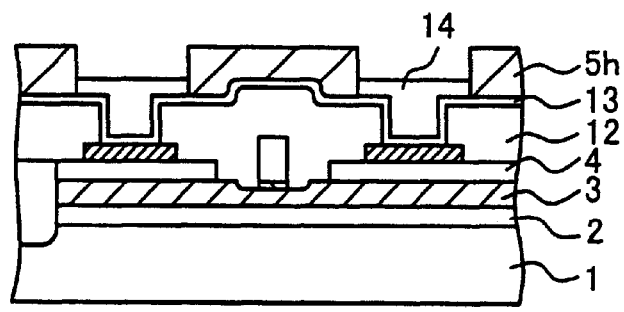
Figure 2L:
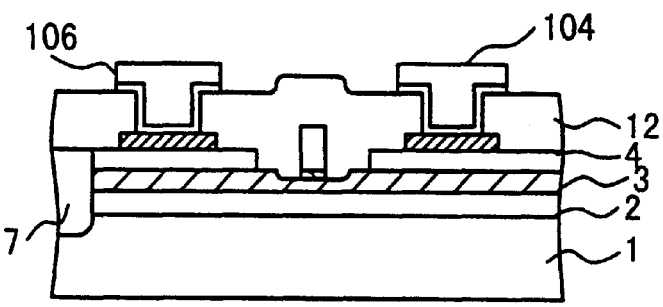

Next, as shown in FIG. 2J, the photoresist film 5g is removed. Then, by the sputtering method, a Ti film and a Pt film are deposited to have the film thickness of 100 nm to form a lower wiring layer 13. Then, a photo-resist film 5h is formed to have an opening in a forming region of the source/drain electrode which contain a source/drain stripe electrode. An Au layer is planted by an electrolysis plating method to have the film thickness of about 2 μm to form an Au plating film 14. After that, the photo-resist film 5h is removed. Using the Au plating film as a mask, the Pt film is selectively removed by the ion milling method and the Ti layer is selectively removed by the RIE method, to form the source stripe electrode 106 and the drain stripe electrode 104.

The preferred embodiments are described above. However, the present invention is not limited to them. Any modification may be made within the scope and spirit of claims.

Also, the present invention is applied to a MESFET. However, the present invention can be applied to a field effect transistor called an HEMT.

Further, the present invention can be applied to not only a field effect transistor as a single body but also a field effect transistor on a semiconductor integrated circuit device (MMIC). When the present invention is applied to the MMIC, a wiring pattern is formed to connect to another circuit on the integrated circuit in the wiring forming process shown in FIGS. 2H and 2J.

The gate finger electrode and the extended gate electrode are formed of a gate metal layer containing a Schottky material layer which is Schottky contact with the active region and a high conductive metal layer formed on the gate metal layer. The resistance section is formed of the gate metal layer.

As described above, according to the field effect transistor of the present invention, a resistance section for the operation stabilization in the millimeter wave band can be formed in a transistor forming region using the gate metal. Therefore, the element forming region can be made small so that the field effect transistor can be realized in a small size, compared with the conventional example in which the resistance section is provided the transistor forming region.

Also, the resistance section can be formed in the gate electrode forming process without adding any special process. Therefore, it is possible to reduce the number of processes, compared with the conventional example, and the reduction in cost can be attempted.

What is claimed is:

1. A field transistor, comprising:
   a compound semiconductor substrate having an active region;
   a gate finger electrode formed on said active region;
   source and drain stripe electrodes formed on said active region to sandwich said gate finger electrode apart from said gate finger electrode;
   an extended gate electrode connected with said gate finger electrode;
   extended source and drain electrodes connected with said source and drain stripe electrodes, respectively;
   a gate bus bar, said gate finger electrode extending from said gate bus bar; and
   a resistance section provided between said gate finger electrode and said extended gate electrode in a transistor forming region, said resistance section being formed between said extended gate electrode and said gate bus bar.

2. A field effect transistor according to claim 1, wherein said resistance section is formed of a gate metal layer which has a Schottky contact with said active region.

3. A field effect transistor according to claim 2, wherein said gate finger electrode and said extended gate electrode are formed on said gate metal layer and a first metal layer is formed on said gate metal layer.

4. A field effect transistor, comprising:
   a compound semiconductor substrate having an active region;
   a gate finger electrode formed on said active region;
   source and drain stripe electrodes formed on said active region to sandwich said gate finger electrode apart from said gate finger electrode;
   an extended gate electrode connected with said gate finger electrode;
   extended source and drain electrodes connected with said source and drain stripe electrodes, respectively; and
   a resistance section provided between said gate finger electrode and said extended gate electrode in a transistor forming region, wherein
   a plurality of said gate finger electrodes extend from a gate bus bar, and said resistance section is formed between said extended gate electrode and said gate bus bar.

5. A field effect transistor according to claim 2, wherein said gate metal layer has a laminate structure of a Schottky material layer having Schottky contact with said active layer and a second metal layer.

6. A field effect transistor according to claim 5, wherein said Schottky material layer is formed of a material selected from the group consisting of W, Ni, Ti, Pt, Mo, and WSi.

7. A field effect transistor according to claim 5, wherein said gate metal layer includes a barrier layer formed between said Schottky material layer and said second metal layer.

8. A field effect transistor according to claim 7, wherein said barrier layer is formed of TiN.

9. A field effect transistor according to claim 2, wherein said compound semiconductor substrate is a GaAs substrate.

10. A field effect transistor comprising:
    a substrate having an insulating film formed on said substrate and a compound semiconductor channel layer surrounded by said insulating film and a compound semiconductor contact layer formed on said channel layer;

a gate metal layer formed on said channel layer and said insulating film to have a first pattern for a gate finger electrode, a gate bus bar, a resistance section and an extended gate electrode;

a first metal layer formed on said gate metal layer have a second pattern for said gate finger electrode, said gate bus bar, and said extended gate electrode; and a second metal layer formed on said contact layer to sandwich said gate finger electrode apart from said gate finger electrode for a source stripe electrode and a drain stripe electrode.

11. A field effect transistor according to claim 10, wherein said gate metal layer includes:

a Schottky material layer having a Schottky contact with said channel layer; and a third metal layer on said Schottky material layer.

12. A field effect transistor according to claim 11, wherein said Schottky material layer is formed of a material selected from the group consisting of W, Ni, Ti, Pt, Mo, and WSi.

13. A field effect transistor according to claim 11, wherein said gate metal layer further includes a barrier layer between said Schottky material layer and said second metal layer.

14. A field effect transistor according to claim 13, wherein said barrier layer is formed of TiN.

* * * * *